United States Patent
Oike et al.

(10) Patent No.: US 10,872,405 B2
(45) Date of Patent: Dec. 22, 2020

(54) SYSTEM FOR CREATING COMPONENT SHAPE DATA FOR IMAGE PROCESSING, AND METHOD FOR CREATING COMPONENT SHAPE DATA FOR IMAGE PROCESSING

(71) Applicant: FUJI CORPORATION, Chiryu (JP)

(72) Inventors: Hiroshi Oike, Chiryu (JP); Shuichiro Kito, Toyota (JP); Kenji Sugiyama, Anjo (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/345,782

(22) PCT Filed: Nov. 1, 2016

(86) PCT No.: PCT/JP2016/082498
§ 371 (c)(1),
(2) Date: Apr. 29, 2019

(87) PCT Pub. No.: WO2018/083745
PCT Pub. Date: May 11, 2018

(65) Prior Publication Data
US 2020/0058120 A1    Feb. 20, 2020

(51) Int. Cl.
*G06T 7/00* (2017.01)
*G06T 17/20* (2006.01)
*G06F 3/0484* (2013.01)

(52) U.S. Cl.
CPC ............ *G06T 7/0006* (2013.01); *G06T 17/20* (2013.01); *G06F 3/04845* (2013.01); *G06T 2207/20104* (2013.01)

(58) Field of Classification Search
CPC .................................................. G06T 7/0006
(Continued)

(56) References Cited

U.S. PATENT DOCUMENTS

| 8,867,846 B2 | 10/2014 | Kawai et al. |
| 2011/0243456 A1* | 10/2011 | Kawai ............... G06K 9/6253 382/203 |

(Continued)

FOREIGN PATENT DOCUMENTS

| EP | 2 372 610 A2 | 10/2011 |
| JP | 10-135686 A | 5/1998 |

(Continued)

OTHER PUBLICATIONS

Extended European Search Report dated Sep. 25, 2019 in corresponding European Patent Application No. 16920499.7, 12 pages.

(Continued)

*Primary Examiner* — Shivang I Patel
(74) *Attorney, Agent, or Firm* — Oblon, McClelland, Maier & Neustadt, L.L.P.

(57) ABSTRACT

A system for creating component shape data for image processing to be used when performing image recognition of a component to be mounted by a component mounter, the system including: a display section; a wire frame drawing section configured to draw a wire frame on top of the component image, and to move a position of a side of the wide frame in accordance with a drag operation of an operator; a minimum unit specifying section configured to specify a minimum unit for when measuring the shape data of the measurement target portion surrounded by the wire frame; and a component shape data creation section configured to create the component shape data for image processing by measuring with an accuracy using the minimum unit specified by the minimum unit specifying section for the shape data of the measurement target portion surrounded by the wire frame.

11 Claims, 5 Drawing Sheets

(58) Field of Classification Search
USPC .......................................................... 345/419
See application file for complete search history.

(56) References Cited

U.S. PATENT DOCUMENTS

| | | |
|---|---|---|
| 2013/0177250 A1 | 7/2013 | Yamamoto |
| 2016/0071320 A1* | 3/2016 | Smith .................. G02B 27/017 |
| | | 345/633 |
| 2016/0125590 A1 | 5/2016 | Yoshida |

FOREIGN PATENT DOCUMENTS

| | | |
|---|---|---|
| JP | 11-108620 A | 4/1999 |
| JP | 2011-211088 A | 10/2011 |
| JP | 2011-233737 A | 11/2011 |

OTHER PUBLICATIONS

Anonymous: "2.2. Rectangle Selection", GNU Image Manipulation Program—User Manual, Oct. 19, 2016, pp. 1-7, XP055622000, Retrieved from the Internet: URL:http://web.archive.org/web/20161019043335/https://docs.gimp.org/2.8/en/gimp-tool-rect-select.html [retrieved on Sep. 13, 2019].

International Search Report dated Dec. 6, 2016 in PCT/JP2016/082498 filed on Nov. 1, 2016.

* cited by examiner

SYSTEM FOR CREATING COMPONENT SHAPE DATA FOR IMAGE PROCESSING, AND METHOD FOR CREATING COMPONENT SHAPE DATA FOR IMAGE PROCESSING

TECHNICAL FIELD

Disclosed herein is a system and a method for creating component shape data for image processing used when performing image recognition of components to be mounted using a component mounter.

BACKGROUND ART

Generally, when performing image recognition at a component mounter by using a camera to image a component being held by a suction nozzle, component shape data (data representing external visual characteristics of the component such as dimensions of the component body and positions, width, length, pitch, and quantity of leads) created in advance and used for image processing is used to perform image recognition of the component, and a determination is made about the pickup position deviation amount of the component and whether the pickup orientation is acceptable. Conventionally, when creating component shape data for image processing at a user side component mounter, in addition to a method using CAD data of the component, there is a method of using a camera to image a component that is a target for creation of component shape data for use in image processing, and using the captured image to create the component shape data for use in image processing.

With this type of system for creating component shape data for use in image processing, an operator must specify which portions of the component image captured by the camera to measure, and to do so the operator draws a wire frame on top of the component image such that the wire frame surrounds the portion to be measured (for example, a component body portion, a row of leads, or the like) of the component image displayed on the screen, then operates a mouse to use a mouse pointer displayed on the display device to select a size-changing handle at the center of a side of the wire frame, and specify the edge positions of the measurement target positions by performing a drag operation to move the position of the wire frame towards the edge position of the measurement target portion, aligning them, and performing these operations for the four sides of the wire frame, thereby creating component shape data for use in image processing by the shape data (for example, lengthwise and widthwise dimensions or the like) of the measurement target portion surrounded by the four sides of the wire frame being measured.

CITATION LIST

Patent Literature

Patent Literature 1: JP-A-2011-211088

BRIEF SUMMARY

Technical Problem

However, components that are targets for creation of component shape data for image processing come in various different sizes, and the required accuracy for measuring shape data of a measurement target portion of a component (minimum unit of measurement) becomes finer (required to more decimal places) the smaller the component. Due to this, conventionally, to maintain measurement accuracy for the smallest component of the components that are targets for creation of component shape data for image processing, the minimum unit size for measurement is set to the smallest possible unit (for example, 1 µm).

In this case, because large components are measured with the same accuracy as small components, the minimum unit of measurement accuracy exceeds what is required for the measurement accuracy of large components, and measurement is performed to decimal places that are not required. Therefore, with large components, after measurement of the component data, it is necessary for an operator to manually round off the unnecessary decimal places from the measurement value, which is troublesome.

Solution to Problem

To solve the above problem, disclosed herein is a system for creating component shape data for image processing to be used when performing image recognition of a component to be mounted by a component mounter, the system including: a display section configured to display a captured component image of a component that is a creation target for the component shape data for image processing; a wire frame drawing section configured to draw a wire frame on top of the component image such that the wire frame surrounds a measurement target portion of the component image displayed on the display section, and to move a position of a side of the wide frame in accordance with a drag operation of an operator; a minimum unit specifying section configured to specify a minimum unit (valid minimum decimal place) for when measuring the shape data of the measurement target portion surrounded by the wire frame; and a component shape data creation section configured to create the component shape data for image processing by measuring with an accuracy using the minimum unit specified by the minimum unit specifying section for the shape data of the measurement target portion surrounded by the wire frame.

With this configuration, because a minimum unit specifying section configured to specify a minimum unit for when measuring the shape data of the measurement target portion surrounded by the wire frame is provided, it is possible to specify a minimum unit required for measurement of the shape data of the measurement target portion in accordance with the size, type, or the like of the measurement target portion. As a result, it is possible to specify a minimum unit with more decimal places for the minimum unit of measurement values for small components (small measurement target portions), and to specify a minimum unit with fewer decimal places for the minimum unit of measurement values for large components (large measurement target portions), enabling the minimum unit in terms of decimal places to be specified in accordance with the size, type, or the like of the component or measurement target portion. Accordingly, by being able to perform measurement of shape data of the measurement target portion using an accuracy of a minimum unit appropriately specified in accordance with the size, type, or the like of the measurement target portion, there is no need for an operator to perform troublesome work such as rounding values by entering values to a certain number of decimal places that are not required after measurement of the shape data, thereby improving workability and enabling efficient creation of component shape data for image processing.

However, when moving a position of a side of a wire frame in accordance with a drag operation of an operator, one may consider moving the position of the side of the wire frame by one pixel at a time (or by a minimum unit of the smallest decimal place), in which case, when an operator aligns a position of a side of the wire frame using a drag operation with the edge position of a measurement target portion for a large component (a large measurement target portion), there is a high likelihood that the position of the side of the wire frame is deviated from position smallest unit required for measurement of the measurement target portion. In this case, too, decimal places lower than the specified minimum unit of the measurement value of the measurement target portion could be omitted by being automatically rounded, which would allow the measurement value of the measurement target portion to be obtained at the accuracy of the specified minimum unit, but this would require a function for perform the omitting by automatically rounding the unnecessary decimal places.

Here, the wire frame drawing section may be configured to move the position of a side of the wire frame in accordance with a drag operation of an operator by a pitch at a time based on the minimum unit specified in the minimum unit specifying section. Accordingly, the position of the side of the wire frame being moved one pitch at a time in accordance with a drag operation is always aligned with a position based on the minimum unit specified by the minimum unit specifying section, a minimum unit of the measurement value of the measurement target portion and the minimum unit specified by the minimum unit specifying section always match, and there is no need for a function that automatically omits unnecessary decimal places by rounding them.

Note that, instead of a wire frame drawing section, an edge position specifying section for specifying edge positions of the measurement target portion in the component image displayed on the display section may be provided, and the component shape data for image processing may be created by measuring the shape data of the measurement target portion for which the edge positions have been specified by the edge position specifying section at the accuracy of the specified minimum unit. In this case, too, it is possible to perform measurement of the shape data of the measurement target portion at an accuracy of a minimum unit specified appropriately in accordance with the size or type of the measurement target portion, such that there is no need for an operator to perform troublesome work such as rounding values by entering values to a certain number of decimal places that are not required after measurement of the shape data.

For example, in a case in which a body portion and a lead of a leaded component are measurement target portions, the minimum unit required for measuring the body portion is larger than the minimum unit required for measuring the lead. Taking this into account, the minimum unit specifying section, in a case in which there are multiple measurement target portions in the component image, may specify the minimum unit when measuring the shape data of each respective measurement target portion for each measurement target portion. Accordingly, even in a case in which the minimum units required for measuring multiple measurement target portions of a component image are different, it is possible to specify a minimum unit that is appropriate for each measurement target portion.

Further, the minimum unit specifying section may be configured such that an operator specifies the minimum unit to use when measuring the shape data of the measurement target portion by selecting from multiple minimum units that are set in advance, or, such that an operator specifies the minimum unit to use when measuring the shape data of the measurement target portion by entering a value within a minimum unit range for which specifying is possible.

Alternatively, the minimum unit specifying section may be configured to automatically specify the minimum unit to use when measuring shape data of the measurement target portion based on information of the measurement target portion of the component that is the target for creation for the component shape data for image processing. For example, in a case in which the measurement target portion is an electrode such as a lead or a bump, it would be possible to automatically specify an appropriate minimum unit for measurement.

Further, the minimum unit specifying section may be configured to automatically specify the minimum unit to use when measuring shape data of the measurement target portion based on a size of the wire frame surrounding the measurement target portion. Accordingly, for example, it is possible to automatically specify the minimum unit that is appropriate for the size of the measurement target portion according to a rule such as that the larger the size of the measurement target portion, the larger the minimum unit to be used for measurement.

Further, the minimum unit specifying section may be configured such that an operator specifies the minimum unit by switching between a manual specifying mode in which an operator selects or enters the minimum unit to be used when measuring the shape data of the measurement target portion, and an automatic specifying mode in which the minimum unit to be used when measuring the shape data of the measurement target portion is specified automatically. Accordingly, for example, an experienced operator, by selecting the manual specifying mode, is able to specify a minimum unit that is appropriate for measuring the measurement target portion based on experience, but in cases of an operator with less experience or when prioritizing productivity, by selecting the automatic specifying mode, it is possible to prevent an incorrect minimum unit being specified by an inexperienced operator and to create component shape data for image processing efficiently while reducing the workload.

DESCRIPTION OF EMBODIMENTS

Figure 1:
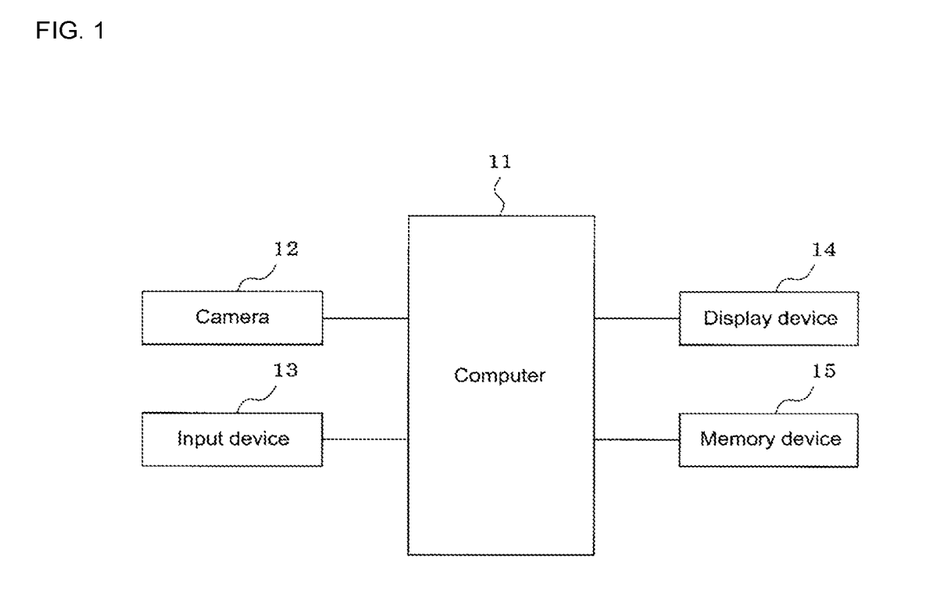
FIG. 1 is a block diagram showing the configuration of a system for creating component shape data for image processing of an embodiment.

A first and a second embodiment are described below.
First Embodiment
A first embodiment will be described with reference to FIGS. 1 to 5. As shown in FIG. 1, a system for creating component shape data for image processing is provided with: computer 11 such as a personal computer; camera 12 that images a component that is a target for creating component shape data for image processing; input device 13 such as a keyboard, mouse, or touchscreen panel; display device 14 (display section) such as a liquid crystal display or a CRT; and memory device 15 that memorizes various pieces of data such as programs illustrated in FIGS. 3 to 5 performed when creating component shape data for image processing that are described later, the created component shape data for image processing, and the like. Memory device 15 is configured from a non-volatile memory that stores data rewritably and that retains the data when the power to the device is turned off (for example, a hard disk device or the like).

Computer 11 of the system for creating component shape data for image processing of the first embodiment, although not shown, is provided externally to the component mounter (externally to the component mounting line), and is connected such that communication is possible to each component mounter or a production management computer of the component mounting line via a network.

Figure 2:
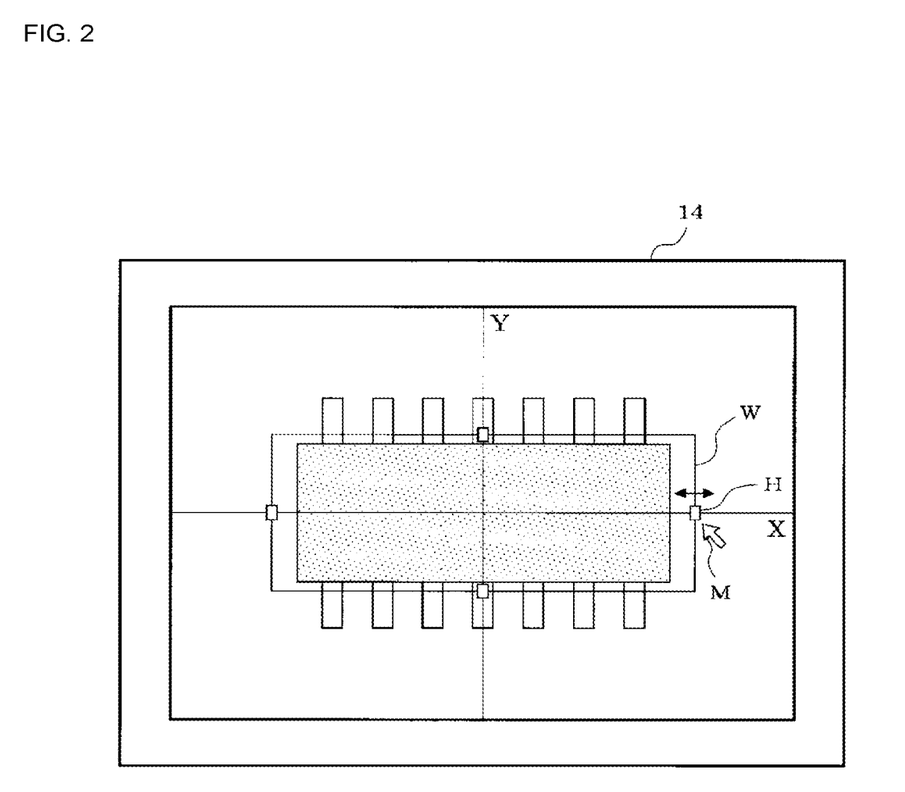
FIG. 2 shows an example of a component image and a wire frame.

Computer 11, by performing the programs of FIGS. 3 to 5 described later, as shown in FIG. 2, functions as: a "wire frame drawing section" that draws wire frame W, which is for surrounding a measurement target portion (for example, a body portion) of a component image displayed on display section 14, on the component image and moves a position of a side of wire frame W in accordance with a drag operation of an operator; and a "minimum unit specifying section" that specifies a minimum unit (effective smallest decimal place) for when measuring the shape data of the measurement target portion surrounded by the wire frame. Further, computer 11, by performing the programs for creating component shape data for image processing of FIGS. 3 and 4 that are described later, functions as a "component shape data creation section" that creates component shape data for image processing by measuring the shape data of the measurement target portion surrounded by wire frame W using the specified accuracy of the minimum unit.

Figure 3:
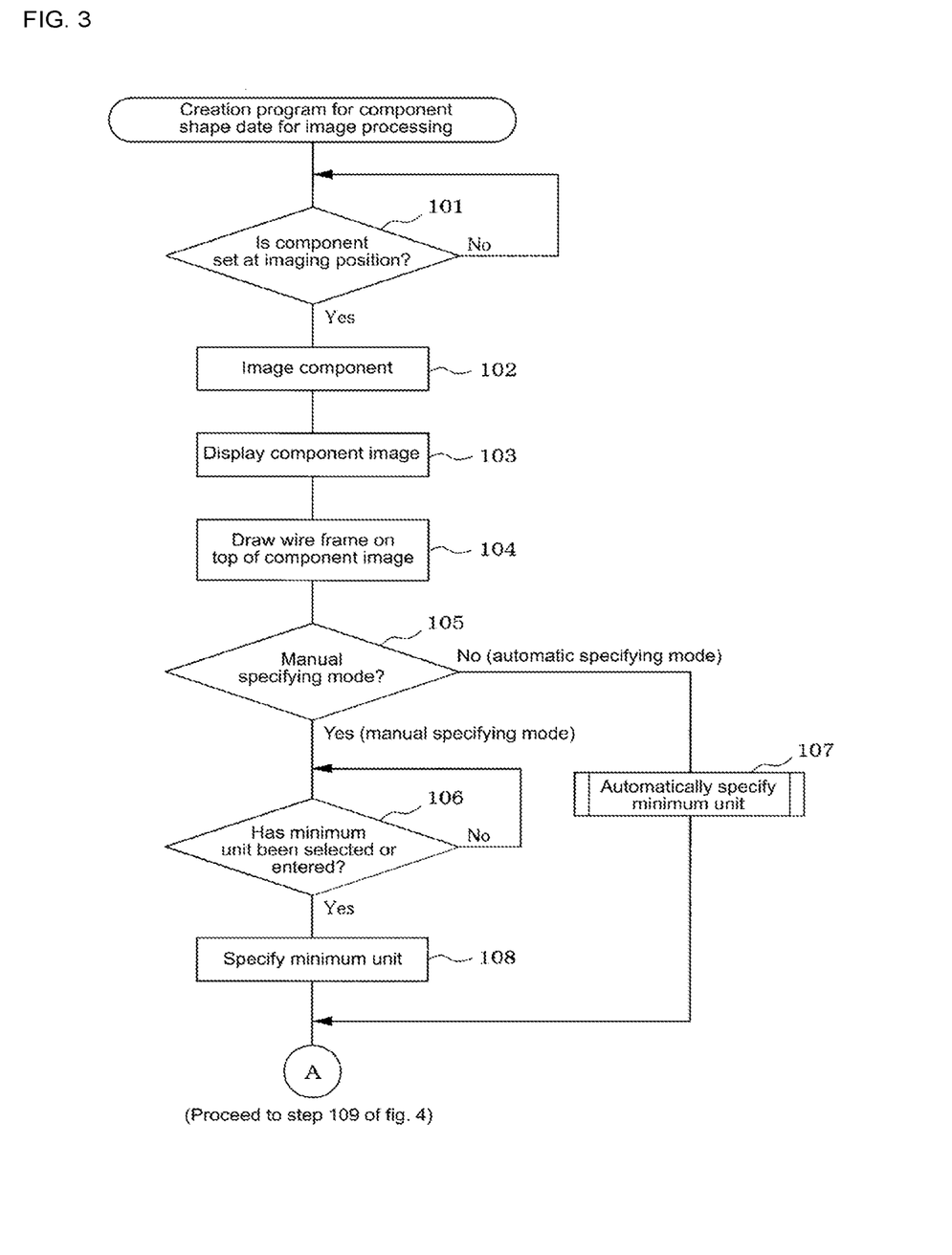
FIG. 3 is a flowchart showing a flow of a first half of processing of a creation program for component shape data for image processing.
Figure 4:
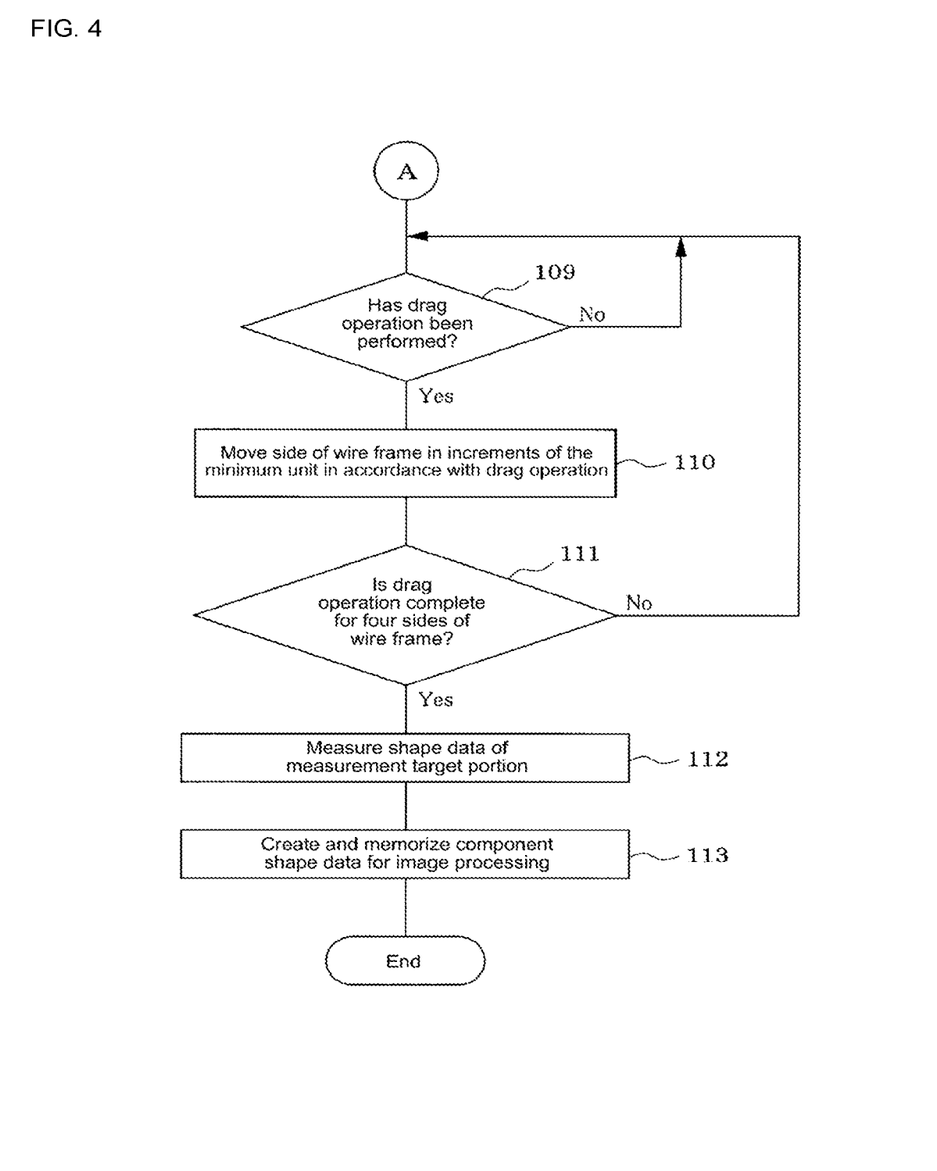
FIG. 4 is a flowchart showing a flow of a second half of processing of a creation program for component shape data for image processing.
Figure 5:
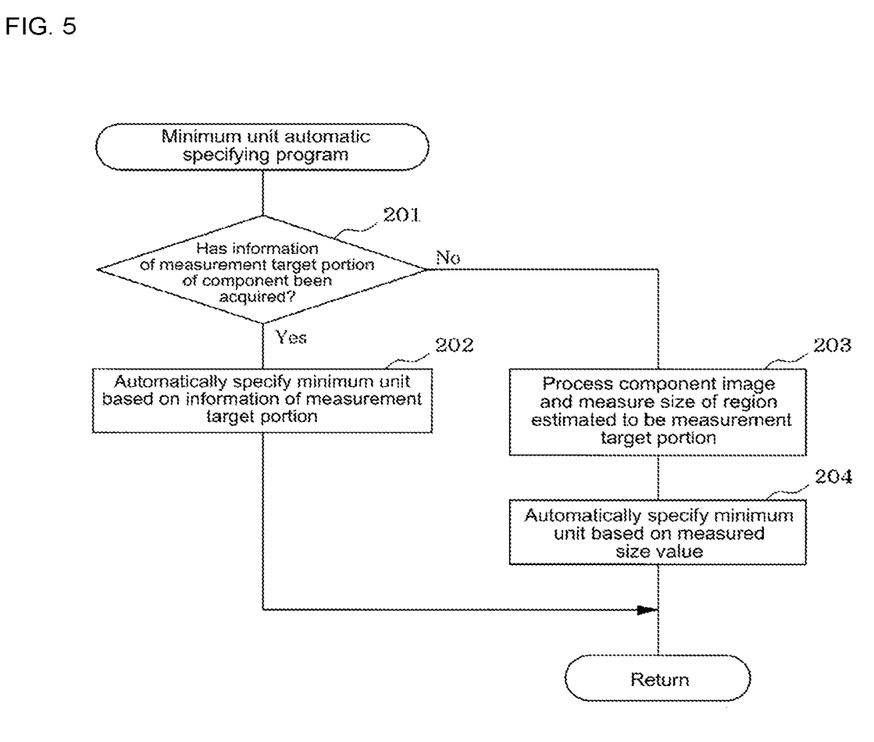
FIG. 5 is a flowchart showing processing of a minimum unit automatic specifying program.

A description of each function (1) to (3) realized by computer 11 performing the programs of FIGS. 3 to 5 is given below.

(1) Function as a Wire Frame Drawing Section

As shown in FIG. 2, wire frame W for surrounding the measurement target portion in the component image displayed on display device 14 is drawn on top of the component image. An operator uses input device 13 such as a mouse to click and hold with mouse pointer M size-changing handle H at the center of a side of wire frame W, and drags mouse pointer M in a direction (left in the example shown in FIG. 2) towards an edge position of the measurement target portion, and aligns the position of the side of wire frame W with an edge position of the measurement portion target. The operator, by performing the drag operation in turn on the four sides of wire frame W one at a time, aligns the four sides of wire frame W with the edge positions in four directions of the measurement target portion.

However, when moving a position of a side of a wire frame in accordance with a drag operation of an operator, one may consider moving the position of the side of wire frame W by one pixel at a time (or by a minimum unit of the smallest decimal place), in which case, when an operator aligns a position of a side of wire frame W using a drag operation with the edge position of a measurement target portion for a large component (a large measurement target portion), there is a high likelihood that the position of the side of wire frame W is deviated from position smallest unit required for measurement of the measurement target portion. In this case, too, decimal places lower than the specified minimum unit of the measurement value of the measurement target portion could be omitted by being automatically rounded, which would allow the measurement value of the measurement target portion to be obtained at the accuracy of the specified minimum unit, but this would require a function for perform the omitting by automatically rounding the unnecessary decimal places.

Here, in the first embodiment, the position of the side of wire frame W is moved one pitch at a time in accordance with the drag operation of the operator based on the specified minimum unit. Here, for example, in a case of a minimum unit of 1 mm, until the movement amount of the drag operation reaches 0.5 mm, which is the mid-value of the minimum unit, the position of the side of wire frame W does not move, and as soon as 0.5 mm is reached, the position of the side of wire frame W moves exactly 1 mm, which is the minimum unit. Accordingly, the positions of the sides of wire frame W that are moved in accordance with the drag operation are always aligned with the position based on the specified minimum unit, a minimum unit of the measurement value of the measurement target portion and the specified minimum unit always match, and there is no need for a function that automatically omits unnecessary decimal places by rounding them.

(2) Function as a Minimum Unit Specifying Section

For example, in a case in which a body portion and a lead of a leaded component are measurement target portions, the minimum unit required for measuring the body portion is larger than the minimum unit required for measuring the lead. Taking this into account, in the first embodiment, in a case in which there are multiple measurement target portions in the component image, the minimum unit when measuring the shape data of each respective measurement target portion is specified for each measurement target portion. Accordingly, even in a case in which the minimum units required for measuring multiple measurement target portions of a component image are different, it is possible to specify a minimum unit that is appropriate for each measurement target portion.

Further, in the first embodiment, the mode for specifying the minimum unit to be used when measuring shape data of the measurement target portion surrounded by wire frame W can be switched by an operator operating input device 13 between a "manual specifying mode" in which an operator selects or enters the minimum unit, and an "automatic specifying mode" in which the minimum unit is specified automatically.

Here, in the "manual specifying mode", an operator specifies the minimum unit by using one of "selection specifying" and "input specifying". In "selection specifying", multiple minimum units that can be selected are displayed on display device 14. For example, multiple minimum units such as 1 μm, 0.01 mm, 0.1 mm, 1 mm, 1 mil (0.0254 mm), 0.01 in (0.254 mm), 0.1 in (2.54 mm), and so on, are displayed on display device 14, and an operator specifies the minimum unit by selecting one of the selectable multiple minimum units using a mouse or the like of input device 13 considering the size, type, and the like of the measurement target portion.

On the other hand, with "input specifying", an operator uses a keyboard or the like of input device 13 to specify the minimum unit by entering the minimum unit within a specifiable range in accordance with the size and type of the measurement target portion. With "input specifying", without being restricted to selectable minimum units, it is possible to enter minimum unit values (for example, 5 μm, 0.5 mm, 2 mm) that cannot be selected with "selection specifying" and the minimum unit can be entered as any value within the specifiable range for the minimum unit.

With both "selection specifying" and "input specifying", for example, if the measurement target portion of the component is the body portion, a value of, for example, 1/10th of the size of the body portion may be specified as the minimum unit. In a case in which the measurement target portion is a lead, for example, a fixed value of 0.1 mm may be specified for the minimum unit. Note that, the configuration may be such that only one of "selecting specifying" or "input specifying" is used.

With "automatic specifying mode", for example, the minimum unit to use when measuring the shape data of the measurement target portion may be automatically specified using any of the following specifying methods (a) to (c). In this case, too, for example, when the measurement target portion of the component is the body portion, a value of, for example, 1/10th of the size of the body portion may be specified as the minimum unit, and, when the measurement target portion is a lead, for example, a fixed value of 0.1 mm may be specified for the minimum unit.

(a) Information of the size, type, and the like of the measurement target portion of the component that is the target for creation of component shape data for image processing is read by computer 11, and the minimum unit to be used for measurement of the shape data of the measurement target portion is automatically specified based on the information of the size, type, and the like of the measurement target portion of the component. Here, information of the size, type, or the like of the measurement target portion of the component may be entered into computer 11 via an operator operating a keyboard or the like of input device 13, or information of the size, type, or the like of the measurement target portion of the component may be sent to computer 11 from an external computer such as a production management computer of the component mounting line.

(b) Computer 11 roughly identifies an area estimated to be the measurement target portion of the component by processing the component image, then measures the size of the area, and automatically specifies a minimum unit to use when measuring the shape data of the measurement target portion based on the measurement value of the size.

(c) After a drag operation to align the four sides of wire frame W with the edge positions in the four directions of the measurement target portion, the minimum unit to be used when measuring the shape data of the measurement target portion is automatically specified based on the size of the wire frame W. In this case, processing is performed to automatically omit decimal places lower than the specified minimum unit of the measurement value of the measurement target portion by rounding. Note that, in a case in which the minimum unit is specified based on the size of wire frame W surrounding the measurement target portion, because the minimum unit has not been specified when the drag operation on the wire frame W is performed, computer 11 moves the position of the side of wire frame W one pixel at a time (or by a minimum unit of the smallest decimal place) in accordance with the drag operation of the operator.

As in the first embodiment, by being able to specify the minimum unit by an operator switching between a "manual specifying mode" and an "automatic specifying mode", for example, an experienced operator, by selecting the manual specifying mode, is able to specify a minimum unit that is appropriate for measuring the measurement target portion based on experience, but in cases of an operator with less experience or when prioritizing productivity, by selecting the automatic specifying mode, it is possible to prevent an incorrect minimum unit being specified by an inexperienced operator and to create component shape data for image processing efficiently while reducing the workload.

Note that, it goes without saying that the configuration may be such that only one of "selecting specifying" or "input specifying" is used.

(3) Function as a Component Shape Data Creation Section

Computer 11 creates the component shape data for image processing by measuring the shape data (for example, X-direction dimension, Y-direction dimension, and the like) of the measurement target portion P surrounded by the wire frame W for which the four edges of the wire frame W were automatically aligned to the four edge positions of the measurement target portion P using the above automatic drag processing, using the accuracy of the specified minimum unit.

For example, if leads are the measurement target portion, a row of leads on a measurement target of the component is surrounded by wire frame W, the length of each lead is measured, a lead side edge separated from the side (edge of row) of the wire frame W by a lead pitch is specified using pointer M, the lead pitch is measured, and, further, by dividing the dimension between both sides of wire frame W (length of lead row) by the lead pitch, the quantity of leads is obtained, and the position of each lead is calculated from the position of wire frame W (position of lead row) and the quantity of leads. The measurement of the width of leads may be performed by using the mouse to specify a lead-side edge separated from a side of wire frame W (an edge of the row of leads) by a width of the leads, or by surrounding a single lead with wire frame W and measuring the width of the lead.

If bumps on the lower surface of the component are the measurement target portion, the bump pitch, bump diameter, and position of each bump may be measured by surrounding the entire pattern formed by the bumps with the wire frame W, and using a similar method for measuring the shape data of leads as described above.

Each of the functions (1) to (3) described above is realized by computer 11 performing the programs illustrated in FIGS. 3 to 5. A portion of the processing of each of the programs illustrated in FIGS. 3 to 5 may be processed by hardware. Processing of the programs illustrated in FIGS. 3 to 5 is described below.

Program for creating component shape data for image processing

When the program for creating component shape data for image processing of FIGS. 3 and 4 is started, first, in step 101, processing stands by until a component that is the target for creation of the component shape data for image processing is set at an imaging position within the field of view of camera 12. Next, when the component has been set at the imaging position, proceeding to step 102, camera 12 images the component, then, proceeding to step 103, the component image is displayed on display device 14.

Then, proceeding to step 104, wire frame W for surrounding measurement target portion of the component image displayed on display device 14 is drawn on top of the component image. Next, proceeding to step 105, it is determined whether the mode for specifying the minimum unit is "manual specifying mode", and if it is not "manual specifying mode", that is, it is "automatic specifying mode", proceeding to step 107, the program for automatically specifying the minimum unit of FIG. 5, which is described later, is performed, and the minimum unit to be used in the measurement of the shape data on the measurement target portion is specified automatically.

On the other hand, if it is determined in step 105 that the mode is "manual specifying mode", proceeding to step 106, processing stands by for an operator to select or enter a minimum unit, and when the operator has selected or entered the minimum unit, proceeding to step 108, the minimum unit selected or entered by the operator is specified as the minimum unit to be used for measurement of the shape data of the measurement target portion. Processing of the above steps 105 to 108 performs the role of the minimum unit specifying section.

After the minimum unit is specified in the above steps 107 or 108, proceeding to step 109 of FIG. 4, processing stands by for an operator to perform a drag operation. Then, when the operator has performed the drag operation, proceeding to step 110, the positions of the sides of wire frame W are moved in the drag operation direction in accordance with the drag operation of the operator in increments of the minimum unit specified in the above steps 107 or 108. Processing of the above steps 104 and 109 to 110 performs the role of the wire frame drawing section.

Next, proceeding to step 111, it is determined whether a drag operation has been completed for four sides of wire frame W, and if drag operations have not been completed and there is still a remaining side of wire frame W, processing of the above steps 109 to 111 is repeated. Thus, when all four sides of the wire frame W have been aligned with the edge positions of the measurement target portion in four directions, processing proceeds to step 112 where the component data (for example, X-direction dimension, Y-direction dimension, and the like) of the measurement target portion surrounded by the wire frame W is measured, then, in step 113, the component shape data for image processing is created based on the measured value of the shape data and memorized on memory device 15, then the program ends. Processing of the above steps 112 and 113 performs the role of the component shape data creation section.

Minimum Unit Automatic Specifying Program

With the minimum unit automatic specifying program of FIG. 5, if the "automatic specifying mode" is selected, the sub-routine performed in step 107 of the program for creating component shape for image processing of the above FIGS. 3 and 4 performs the role of the minimum unit specifying section that automatically specifies the minimum unit.

When this program is started, first, in step 201, it is determined whether computer 11 has acquired information of the size, type, and the like of the measurement target portion of the component that is the target for creation of component shape data for image processing, and if the information of the size, shape, and the like of the measurement target portion has been acquired, proceeding to step 202, the minimum unit to be used in measuring the shape data of the measurement target portion is specified automatically based on the acquired information of the size, shape, or the like of the measurement target portion, then the program ends.

On the other hand, if in step 201 above it is determined that the information of the size, type, or the like of the measurement target portion has not been acquired, proceeding to step 203, the area estimated to be the measurement target portion of the component is recognized roughly by processing the component image, and the size of the area is measured. Next, proceeding to step 204, based on the measured value of the size of the area estimated to be the measurement target portion, the minimum unit to be used when measuring the shape data of the measurement target portion is automatically specified, and the program ends.

Component shape data for image processing created by the system for creating component shape data for image processing of the first embodiment is sent to a production management computer of the component mounting line. The production management computer sends the component shape data for image processing to be used by the component mounters for performing image recognition of components to be mounted to each of the component mounters. Thus, each component mounter uses the received component shape data for image processing to perform image recognition of components held by a suction nozzle.

According to the first embodiment described above, because a minimum unit for when measuring the shape data of the measurement target portion surrounded by the wire frame W is specified using a manual specifying mode or an automatic specifying mode, it is possible to specify a minimum unit required for measurement of the shape data of the measurement target portion in accordance with the size, type, or the like of the measurement target portion. As a result, for example, it is possible to specify a minimum unit with more decimal places for the minimum unit of measurement values for small components (small measurement target portions), and to specify a minimum unit with fewer decimal places for the minimum unit of measurement values for large components (large measurement target portions), enabling the minimum unit in terms of decimal places to be specified in accordance with the size, type, or the like of the component or measurement target portion. Accordingly, by being able to perform measurement of shape data of the measurement target portion using an accuracy of a minimum unit appropriately specified in accordance with the size, type, or the like of the measurement target portion, there is no need for an operator to perform troublesome work such as rounding values by entering values to a certain number of decimal places that are not required after measurement of the shape data, thereby improving workability and enabling efficient creation of component shape data for image processing.

Second Embodiment

A second embodiment is described below. However, for sections which are practically the same as the first embodiment, explanations are omitted or abbreviated, with descriptions largely given for sections which are different.

In the above first embodiment, the measurement target portion of the component image displayed on display device 14 is specified by being surrounded by wire frame W, however, in the second embodiment, provided are: an edge position specifying section configured to specify edge positions of a measurement target portion of the component image displayed on display section 14 by an operator using mouse pointer M or the like; a minimum unit specifying section configured to specify a minimum unit for when measuring the shape data of the measurement target portion for which the edge positions have been specified by the edge position specifying section; and a component shape data creation section configured to create the component shape data for image processing by measuring with an accuracy using the minimum unit specified by the minimum unit specifying section for the shape data of the measurement target portion for which the edge positions have been specified by the edge position specifying section.

That is, in the second embodiment, an operator specifies the edge positions of the measurement target portion using a mouse pointer or the like, and the shape data of the measurement target portion is measured using the accuracy of the specified minimum unit, and in other respects the second embodiment is substantially the same as the first embodiment.

In this case, too, it is possible to perform measurement of the shape data of the measurement target portion at an accuracy of a minimum unit specified appropriately in accordance with the size or type of the measurement target portion, such that there is no need for an operator to perform troublesome work such as rounding values by entering values to a certain number of decimal places that are not required after measurement of the shape data, thus the same effects are achieved as with the first embodiment.

A system for creating component shape data for image processing of the present disclosure is not limited to the above embodiments and may be provided inside a component mounter. In this case, when investigating a cause of an error that occurred at the component mounter, the component held by a suction nozzle of the component mounter may be imaged using a component recognition camera of the component mounter, and that component image may be displayed on a display section of the component mounter such that the component shape data for image processing can be recreated. Thus, in a case in which the cause of an error that occurred at a component mounter is a mismatch of the component shape data for image processing, the component shape data for image processing can be corrected appropriately for the image processing system of the component mounter, the frequency of errors at the component mounter can be reduced, and the image recognition accuracy of components can be improved.

Further, the present disclosure is not limited to the first and second embodiments described above and it goes without saying that various embodiments with changes that do not extend beyond the scope of the disclosure are possible, such as that suitable changes may be made to the drag operation method of the sides of wire frame W.

REFERENCE SIGNS LIST

11: computer (wire frame drawing section, minimum unit specifying section, component shape data creation section);
12: camera;
13: input device;
14: display device (display section)
H: size-changing handle;
M: mouse pointer;
W: wire frame

The invention claimed is:

1. A system for creating component shape data for image processing to be used when performing image recognition of a component to be mounted by a component mounter, the system comprising:
a display configured to display a captured component image of a component that is a creation target for the component shape data for image processing; and
processing circuitry configured to
draw a wire frame on top of the component image such that the wire frame surrounds a measurement target of the component image displayed on the display section, and to move a position of a side of the wire frame in accordance with a drag operation of an operator;
specify a minimum unit for when measuring the shape data of the measurement target surrounded by the wire frame; and
create the component shape data for image processing by measuring with an accuracy using the minimum unit specified for the shape data of the measurement target surrounded by the wire frame.

2. The system for creating component shape data for image processing according to claim 1, wherein
the computer moves the position of the side of the wire frame according to the drag operation of the operator by a pitch of the minimum unit.

3. A system for creating component shape data for image processing to be used when performing image recognition of a component to be mounted by a component mounter, the system comprising:
a display configured to display a captured component image of a component that is a creation target for the component shape data for image processing; and
processing circuitry configured to
specify edge positions of a measurement target portion of the component image displayed on the display section;
specify a minimum unit for when measuring the shape data of the measurement target for which the edge positions have been specified; and
create the component shape data for image processing by measuring with an accuracy using the minimum unit specified for the shape data of the measurement target for which the edge positions have been specified.

4. The system for creating component shape data for image processing according to claim 1, wherein
the processing circuitry is configured to, in a case in which there are multiple measurement targets in the component image, specify the minimum unit for when measuring the shape data of the measurement target for each of the measurement targets.

5. The system for creating component shape data for image processing according to claim 1, wherein
the processing circuitry is configured such that an operator specifies the minimum it to use when measuring the shape data of the measurement target by selecting from multiple minimum units that are set in advance.

6. The system for creating component shape data for image processing according to claim 1, wherein
the processing circuitry is configured such that an operator specifies the minimum unit to use when measuring the shape data of the measurement target by entering a value within a minimum unit range for which specifying is possible.

7. The system for creating component shape data for image processing according to claim 1, wherein
the processing circuitry is configured to automatically specify the minimum unit to use when measuring shape data of the measurement target based on information of the measurement target of the component that is the target for creation for the component shape data for image processing.

8. The system for creating component shape data for image processing according to claim 1, wherein
the processing circuitry is configured to automatically specify the minimum unit to use when measuring shape data of the measurement target based on a size of the wire frame surrounding the measurement target.

9. The system for creating component shape data for image processing according to claim 1, wherein
the processing circuitry is configured such that an operator specifies the minimum unit by switching between a manual specifying mode in which an operator selects or enters the minimum unit to be used when measuring the shape data of the measurement target, and an automatic specifying mode in which the minimum twit to be used when measuring the shape data of the measurement target is specified automatically.

10. A method for creating component shape data for image processing to be used when performing image recognition of a component to be mounted by a component mounter, the method comprising:
- displaying processing to display a captured component image of a component that is a creation target for the component shape data for image processing;
- wire frame drawing processing to draw a wire frame on top of the component image such that the wire frame surrounds a measurement target of the component image displayed on the display section, and to move a position of a side of the wire frame in accordance with a drag operation of an operator;
- minimum unit specifying processing to specify a minimum unit for when measuring the shape data of the measurement target surrounded by the wire frame; and
- component shape data creation processing to create the component shape data for image processing by measuring with an accuracy using the minimum unit specified for the shape data of the measurement target surrounded by the wire frame.

11. A method for creating component shape data for image processing to be used when performing image recognition of a component to be mounted by a component mounter, the method comprising:
- displaying processing to display a captured component image of a component that is a creation target for the component shape data for image processing;
- edge position specifying processing to specify edge positions of a measurement target of the component image displayed on the display section;
- minimum unit specifying processing to specify a minimum unit for when measuring the shape data of the measurement target for which the edge positions have been specified by the edge position specifying section; and
- component shape data creation processing to create the component shape data for image processing by measuring with an accuracy using the minimum unit specified for the shape data of the measurement target for which the edge positions have been specified by the edge position specifying section.

* * * * *